(12) United States Patent
Yoshikawa et al.

(10) Patent No.: US 7,205,650 B2
(45) Date of Patent: Apr. 17, 2007

(54) COMPOSITE DEVICES OF LAMINATE TYPE AND PROCESSES

(75) Inventors: Hideki Yoshikawa, Takarazuka (JP); Takashi Umemoto, Hirakata (JP); Hitoshi Hirano, Nishinomiya (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 122 days.

(21) Appl. No.: 10/073,117

(22) Filed: Feb. 12, 2002

(65) Prior Publication Data

US 2002/0117746 A1   Aug. 29, 2002

(30) Foreign Application Priority Data

Feb. 16, 2001   (JP) ............................. 2001-040394

(51) Int. Cl.
*H01L 23/06* (2006.01)

(52) U.S. Cl. .................. 257/703; 257/701; 257/705; 257/668; 257/671; 257/688; 257/760; 257/758; 257/779; 336/200; 336/232; 428/212

(58) Field of Classification Search ............... 257/703, 257/701, 705, 668, 671, 688, 760, 758, 779; 336/200, 232; 428/212
See application file for complete search history.

(56) References Cited

U.S. PATENT DOCUMENTS 5,655,287 A * 8/1997 Ushiro ..................... 29/609
5,903,968 A * 5/1999 Shouji ..................... 29/603.09
6,080,468 A * 6/2000 Yamaguchi ................. 428/212
6,509,687 B1 * 1/2003 Natarajan et al. ........... 313/495
6,730,183 B2 * 5/2004 Tokuda et al. ........... 156/89.12
6,808,577 B2 * 10/2004 Miyazaki et al. ........ 156/89.12

FOREIGN PATENT DOCUMENTS

| JP | 58-145114 | 8/1983 |
|---|---|---|
| JP | 60-106114 | 6/1985 |
| JP | 64-61015 | 3/1989 |
| JP | 5-267972 | 10/1993 |
| JP | 06-3337434 | 12/1994 |
| JP | 2000-150303 | 5/2000 |

OTHER PUBLICATIONS

Japanese Patent Office Communication with partial translation for corresponding Japanese Patent Application No. 2001-040394 dated Jan. 18, 2005.

* cited by examiner

*Primary Examiner*—Douglas W. Owens
*Assistant Examiner*—Junghwa Im
(74) *Attorney, Agent, or Firm*—Armstrong, Kratz, Quintos, Hanson & Brooks, LLP

(57) ABSTRACT

In a composite device of the laminate type having a laminate structure of a composite ceramic layer and a dielectric ceramic layer, the composite ceramic layer including a layer portion having the same composition as the dielectric ceramic layer and a plurality of particle portions formed on the surface of the layer portion. The particle portions are made from magnetic ceramic material. This prevents the ceramic layers of the device from cracking and separating when fired.

3 Claims, 5 Drawing Sheets

COMPOSITE DEVICES OF LAMINATE TYPE AND PROCESSES

A BACKGROUND OF THE INVENTION

1. Field of the Invention

The present invention relates to composite devices of the laminate type for providing various electronic circuits for use in electronic devices such as portable telephones and to processes for producing such composite devices.

2. Description of the Related Art

In recent years it has been required with ever increasing severity that compact electronic devices such as portable telephones be reduced in size. In such a situation, it has been practice to incorporate circuit elements for constituting a device into a composite laminate device and to mount the composite device on a main board.

As shown in FIGS. 5 and 6, the composite device of the laminate type has a laminate structure comprising a plurality of ceramic layers 1, 2 each of which is provided on the surface thereof with a plurality of circuit element patterns 11 or 21 for constituting an inductor or capacitor. Such circuit element patterns 11, 21 are connected to one another through conductor patterns 13, 23 formed on the ceramic layers 1, 2 or conduction channels (via holes) 12, 22 extending through the ceramic layers 1, 2 to provide an electronic circuit such as a filter.

With such composite devices, the ceramic layers 1, 2 are generally made from dielectric ceramic material. It has been proposed to form a pattern (hereinafter referred to as an "L-pattern") for providing an inductance on the magnetic body ceramic layer 1 so as to increase the inductance of the L-pattern and to form a pattern (hereinafter referred to as a "C-pattern") for constituting a capacitor on the dielectric ceramic layer 2 in order to increase the capacitance of the C-pattern [JP-A No. 60-106114 (1985), JP-A No. 6-333743 (1994), etc.].

Composite devices of the type mentioned are fabricated generally in the following manner. A required number of magnetic body boards prepared by forming an L-pattern on the surface of each of magnetic body green sheets are laminated to obtain an inductor laminate, and a required number of dielectric boards prepared by forming a C-pattern on the surface of each of dielectric green sheets are laminated to obtain a capacitor laminate. The two laminates as lapped over each other are fired to join the boards and obtain a sintered laminate. Finally, a plurality of electronic components are mounted on the surface of the sintered laminate as required to complete a composite device of the laminate type in the form of a single chip.

However, the conventional composite device of the laminate type has the following problem. In firing the combined laminate obtained by laminating the magnetic boards comprising magnetic body green sheets and the dielectric boards comprising dielectric green sheets, the magnetic body ceramic layer 1 and the dielectric ceramic layer 2 are curved and greatly deflected by the firing step as shown in FIG. 7 because the magnetic body green sheet and the dielectric green sheet differ greatly in shrinkage, possibly creating a crack K in the resulting laminate.

FIG. 8(a) shows the portion A in FIG. 7 on an enlarged scale before firing, and FIG. 8(b) shows the portion A of FIG. 7 on an enlarged scale after firing. At the joint between the ceramic layers 1, 2 lapping over each other as seen in FIG. 8(a), the circuit element patterns 11, 21 and the via holes 12, 22 corresponding thereto are positioned in match before firing, whereas the circuit element patterns 11, 21 are positioned as shifted or separated from the corresponding via holes 12, 22 after firing as shown in FIG. 8(b), hence the problem of a reduced yield.

SUMMARY OF THE INVENTION

An object of the present invention is to give circuit element patterns sufficient characteristics, to prevent cracking and separation occurring in the firing step, and to provide the structure of a composite laminate device which is available in an improved yield.

The present invention provides a composite device of the laminate type having a laminate structure of a first ceramic layer and a second ceramic layer, each of the ceramic layers having one or a plurality of circuit element patterns formed on a surface thereof to provide an electronic circuit for performing a predetermined function.

The invention provides the composite device of the laminate type having the first ceramic layer made from a composition suited to characteristics of the circuit element pattern formed on a surface thereof and the second ceramic layer comprising:

a layer portion having a same composition as the first ceramic layer and serviceable as a main body, and a plurality of particle portions having a composition suited to characteristics of the circuit element pattern formed on a surface of the second ceramic layer and formed as distributed on a surface or inside the layer portion.

With the composite device of the laminate type, the second ceramic layer comprises the layer portion having the same composition as the first ceramic layer and serviceable as a main body, and the plurality of particle portions formed as distributed on the layer portion. Accordingly, the shrinkage of the entire second ceramic layer when fired is close to the shrinkage of the first ceramic layer since the layer portion as a main body of the second ceramic layer has the same composition as the first ceramic layer. Consequently, the difference between the second ceramic layer and the first ceramic layer is smaller in shrinkage than the difference in the case where a second ceramic layer is entirely made from the composition of a particle portion.

Accordingly, when the laminate structure of the first and second ceramic layers is formed by the firing step in fabricating the composite device of the laminate type embodying the invention, it is unlikely that a great difference will occur between the first and second ceramic layers in shrinkage, consequently diminishing the deflection of the ceramic layers. This prevents the ceramic layers from cracking or separating from each other.

The plurality of particle portions formed as distributed on the layer portion of the second ceramic portion has a composition suited to the characteristics of the circuit element pattern formed on the surface of the second ceramic layer, so that the circuit element pattern formed on the surface of the second ceramic layer exhibits more excellent characteristics than in the case where a pattern is formed on a surface of the first ceramic layer.

Consequently, with the composite device of the laminate type embodying the invention, the circuit element pattern formed on the surface of the second ceramic layer is smaller in size than in the case where a pattern is formed on the surface of the first ceramic layer, rendering the composite device of the laminate type compact.

Stated specifically, the layer portion is made from dielectric material, and the particle portion of the second ceramic layer is made from magnetic material. According to the specific construction, a capacitor pattern (C-pattern) is formed on a surface of the first ceramic layer, and an inductance pattern (L-pattern) on a surface of the second ceramic layer. The magnetized second ceramic layer renders the inductance obtained on the L-pattern greater than the inductance on an L-pattern of the same size formed on a surface of a non-magnetized ceramic layer.

According to another specific construction, the plurality of particle portions formed on the second ceramic layer is distributed approximately uniformly on the surface of the layer portion. Alternatively, the plurality of particle portions formed on the second ceramic layer is distributed approximately uniformly inside the particle portions. With the specific construction, the circuit element pattern formed on the surface of the second ceramic layer obtains effect given by the particle portion to same extent regardless of its position formed on the second ceramic layer. Consequently, the circuit element pattern can be freely arranged on the surface of the second ceramic layer.

The present invention provides a process for fabricating a composite device of the laminate type embodying the invention which process has the steps of:

preparing first green sheets for making first ceramic layers and second green sheets for making second ceramic layers, forming one or a plurality of circuit element patterns on a surface of each of a required number of first green sheets and a required number of the second green sheets, preparing a laminate comprising a plurality of layers by superposing the first green sheets and the second green sheets each having the circuit element pattern or patterns formed thereon, and firing the laminate.

In sheets preparing steps described, the first green sheet is prepared by using dielectric material. Preparing steps of the second green sheets comprises:

preparing material sheets by using the dielectric material, forming a photoresist film on the surface of the material sheet prepared in the preparing step described, providing on the photoresist film a plurality of through holes approximately uniformly distributed by the photolithography method, superposing magnetic material on the material sheet covering the photoresist film, and removing the photoresist film.

The present invention provides a process for fabricating a composite device of the laminate type which process has other steps of preparing the first green sheet by using dielectric material, the second green sheet being prepared by the steps of:

preparing the material sheets by using dielectric material, providing on the material sheet a screen having a plurality of through holes approximately uniformly distributed, and printing magnetic material on a surface of each material sheet through the screen, and removing the screen from the material sheet.

Further, the present invention provides a process for fabricating a composite device of the laminate type which process has other steps of preparing the first green sheet by using dielectric material, the second green sheet being prepared by the steps of:

preparing a slurry made from dielectric material, mixing the slurry with a plurality of discrete particles made from the magnetic material to obtain a slurry mixture, forming the slurry mixture into a strip, drying the obtained slurry mixture of a strip.

With the process for fabricating the composite device of the laminate type embodying the invention, the first green sheet is made from the dielectric material, and the second green sheet comprises a major portion made from the dielectric material and a portion of a plurality of discrete particles made from the magnetic material to obtain the composite device of the laminate type. In firing step, the difference between the first green sheet and the second green sheet is small in shrinkage, diminishing the deflection of the laminate after firing. This prevents the ceramic layers from cracking or separating from each other. Further, a plurality of discrete particles made from magnetic material are distributed on a surface of or inside the second green sheet, so that the second ceramic layer is magnetized. This gives sufficient characteristics to an inductor pattern provided on the surface of the second ceramic layer.

As described above, the present invention providing composite devices of the laminate type and processes for fabricating such devices diminishes the deflection of the ceramic layers in the firing step to thereby eliminate the problem of cracking and separation and achieve an improved yield, and to give the circuit element patterns sufficient characteristics.

BRIEF DESCRIPTION OF THE DRAWINGS

FIG. 3(*b*) is a view showing a photoresist film formed on a surface of the green sheet;

FIG. 3(*c*) is a view showing a plurality of through holes provided on the photoresist film;

FIG. 3(*d*) is a view showing a magnetic film formed on the dielectric green sheet and placed over the photoresist film;

FIG. 3(*e*) is a view showing a plurality of disk-shaped strips made from magnetic material formed on the dielectric green sheet;

FIG. 8(*a*) is an enlarged view of the portion A in FIG. 7 before firing, and FIG. 8(*b*) is an enlarged view of the portion A in FIG. 7 after firing.

DETAILED DESCRIPTION OF EMBODIMENTS

Figure 1:
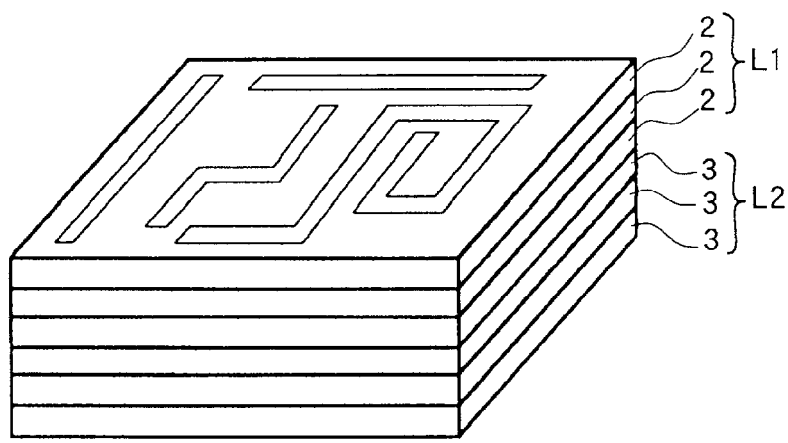
FIG. 1 is a perspective view of a composite device of the laminate type embodying the invention.

Embodiments of the present invention will be described below in detail with reference to the drawings. As shown in FIG. 1, the composite device of the laminate type embodying the invention has a laminate structure including an upper half laminate portion L1 comprising a plurality of dielectric ceramic layers 2 and a lower half laminate portion L2 comprising a plurality of composite ceramic layers 3.

Figure 2:
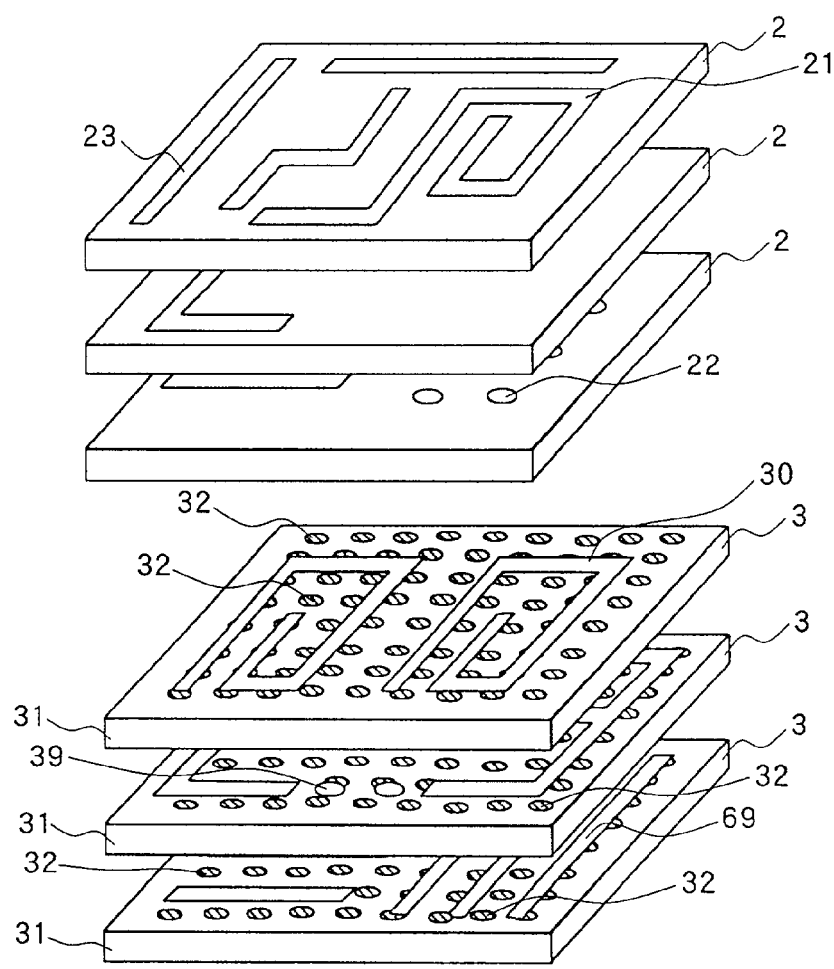
FIG. 2 is an exploded perspective view of the device.

As shown in FIG. 2, the composite ceramic layer 3 comprises a layer portion 31 having a same composition as the dielectric ceramic layer 2 made from dielectric ceramic material, and a plurality of particle portions 32 made from magnetic ceramic material. The particle portions 32 are approximately uniformly distributed on the surface of the layer portion 31.

Formed on the surface of each composite ceramic layer 3 are a plurality of circuit element patterns 30 chiefly including L-patterns. Formed on the surface of each dielectric ceramic layer 2 are a plurality of circuit element patterns 21 chiefly including C-patterns. Specified ceramic layers are provided with a conductor pattern 23 or 69 and via holes 22 or 39 for establishing electrical continuity with circuit element patterns 21, 30 on the same or underlying ceramic layer.

The dielectric material used for the layer portion 31 of the composite ceramic layer 3 can be, for example, a material having a low dielectric constant and consisting mainly of barium oxide, aluminum oxide, or silica, dielectric material of the titanium oxide type, glass ceramic material, or the like. Borosilicate glass or the like may be used to lower the firing temperature.

The particle portion 32 is made from the magnetic ceramic material such as Ni—Fe alloy material, Fe—Al—Si alloy material, oxide magnetic material, Ni—Zn—Cu ferrite, Ni—Zn ferrite, or hexagonal ferrite, which gives permeability to the composite ceramic layer 3. Various glasses such as borosilicate glass may be added to the material to lower the firing temperature. The Ni—Zn—Cu ferrite is not limited particularly; one of such ferrites of various compositions can be selected depending on the purpose. For example, such a ferrite is preferably 15 to 25 mole % in NiO content, 5 to 15 mole % in CuO content and 20 to 30 mole % in ZnO content. The Ni—Zn ferrite is not limited specifically, either, but one of such ferrites having various compositions can be selected according to the purpose. For example, such a ferrite is preferably 10 to 25 mole % in NiO content and 15 to 45 mole % in ZnO content.

In fabricating the composite device of the laminate type of the invention described, dielectric green sheets for making the dielectric ceramic layers 2 are prepared by the doctor blade method or the like as in the prior art. Composite green sheets for making composite ceramic layers 3 are prepared.

Figure 3:
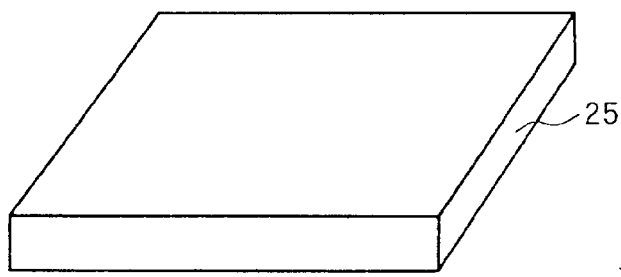
FIG. 3(*a*) is a view showing a dielectric green sheet.
Figure 3:
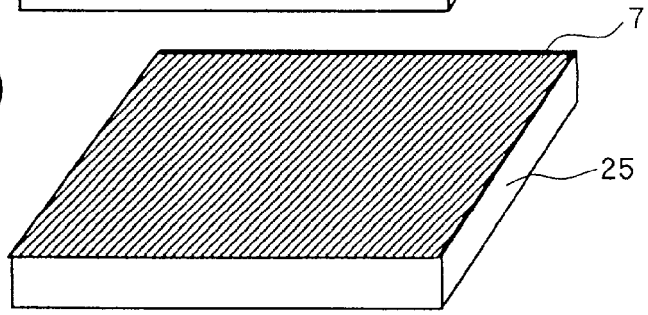
Figure 3:
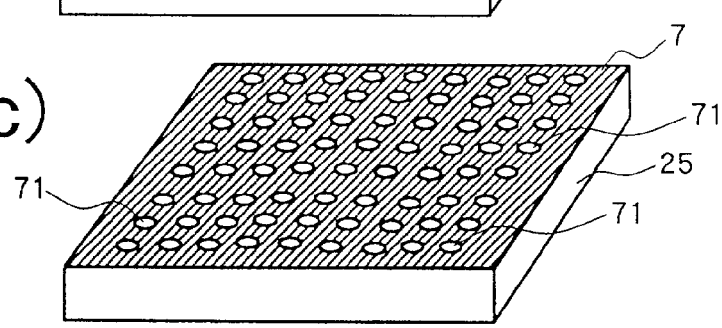
Figure 3:
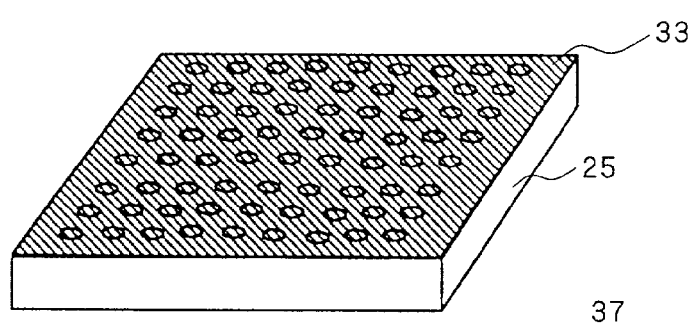
Figure 3:
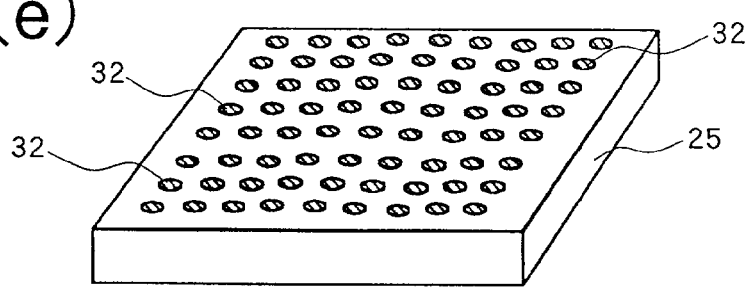

FIGS. 3(a) to 3(e) shows a process for preparing the composite green sheet 37 for making the composite ceramic layer 3. With reference to FIG. 3(b), a photoresist film 7 is formed on a surface of the dielectric green sheet 25 shown in FIG. 3(a). As shown in FIG. 3(c), a plurality of through holes 71 are provided on the photoresist film 7 by the photolithography method. Subsequently, as shown in FIG. 3(d), a magnetic film 33 made from the magnetic ceramic material is formed on the dielectric green sheet 25 covering the photoresist film 7. Finally, the photoresist film 7 is separated and removed. As a result, formed on the surface of the dielectric green sheet 25 are a plurality of particle portions 32 which may be disc-shaped and are made from magnetic ceramic material to prepare the composite green sheet 37, as shown in FIG. 3(e). The magnetic film 33 shown in FIG. 3(d) can be formed by sputtering or plating method. The particle portions 32 can also be formed by printing the magnetic ceramic material according to screen printing method.

Figure 4:
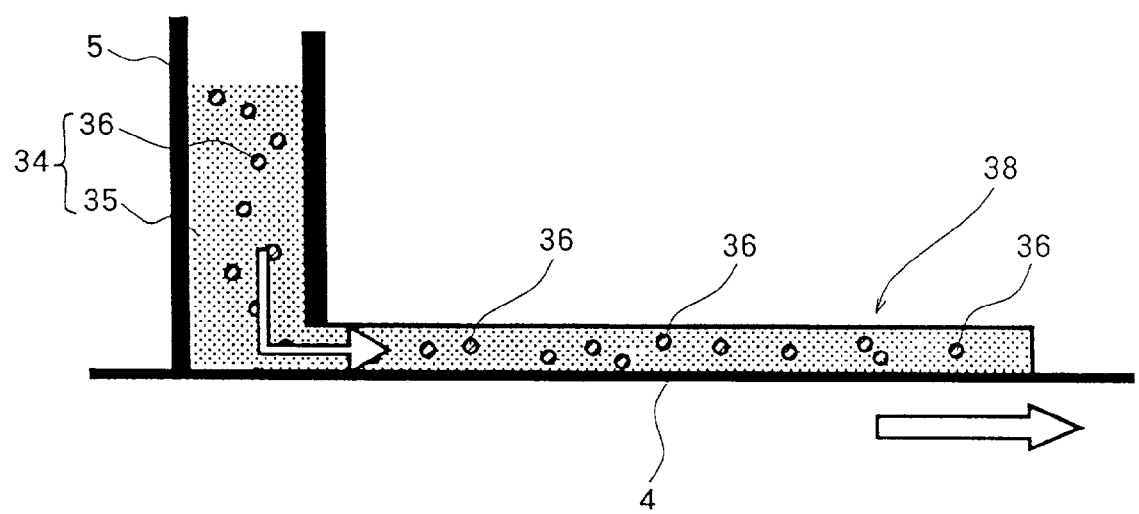
FIG. 4 is a diagram for illustrating another process for fabricating the composite ceramic layer.
Figure 5:
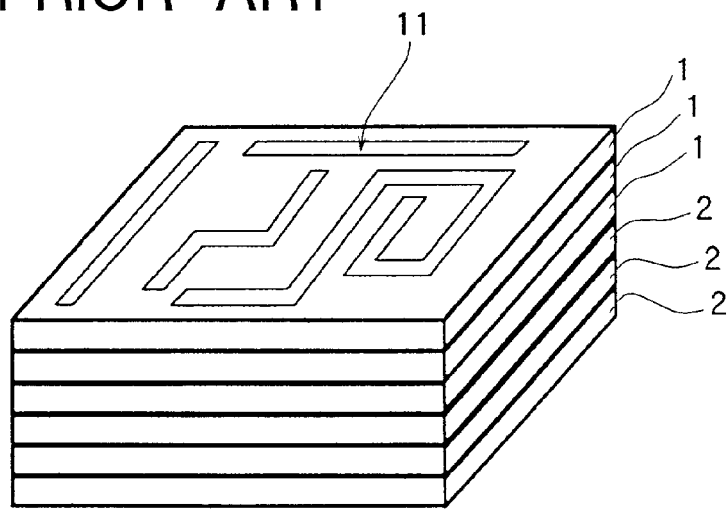
FIG. 5 is a perspective view of a conventional composite device of the laminate type.
Figure 6:
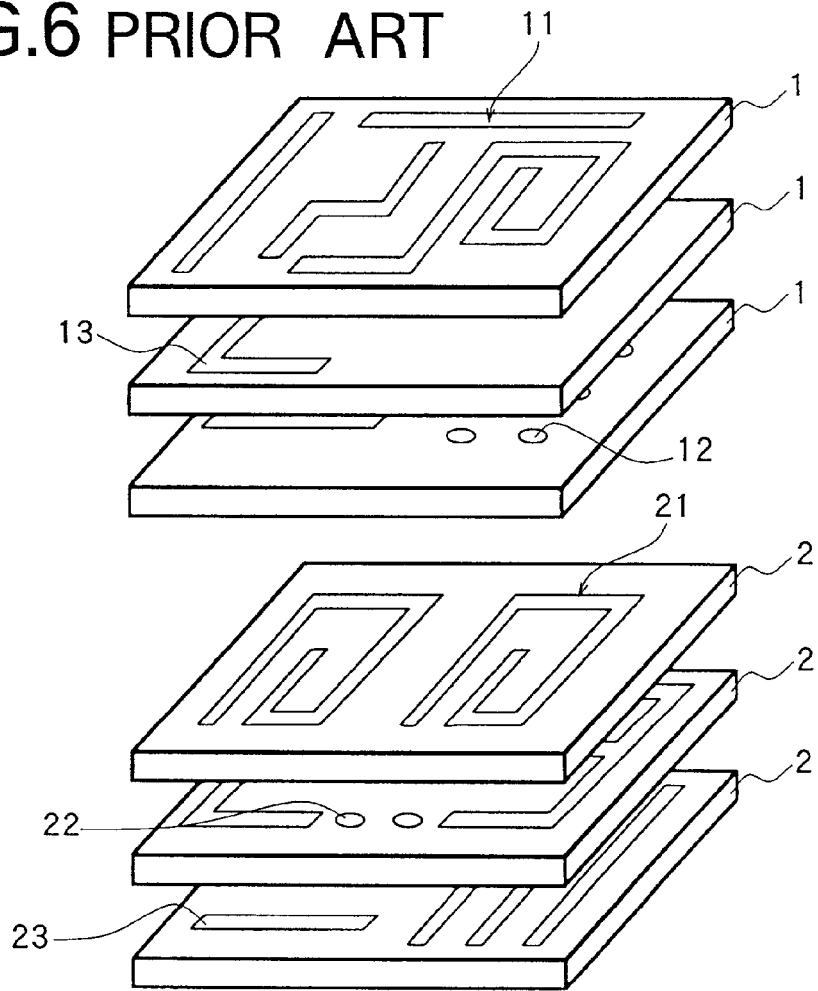
FIG. 6 is an exploded perspective view of the conventional composite device of the laminate type.
Figure 7:
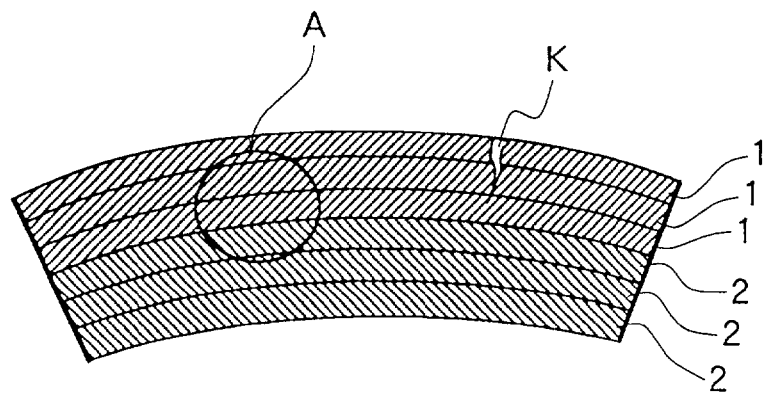
FIG. 7 is a diagram for illustrating a problem encountered with the device.
Figure 7:
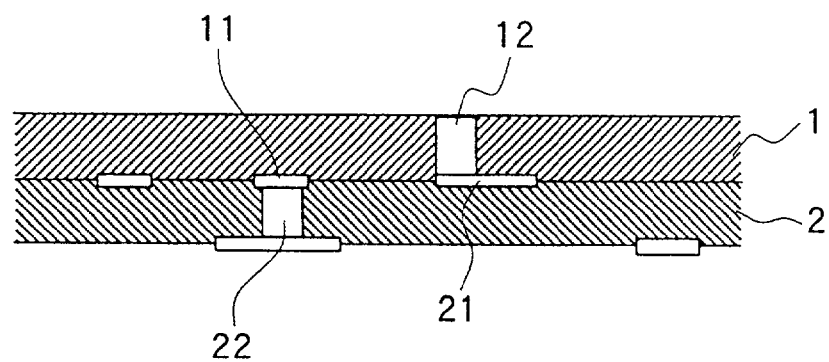
Figure 7:
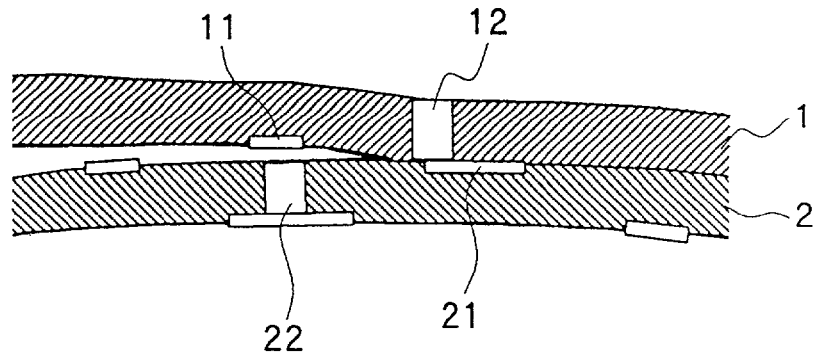

FIG. 4 shows a process for preparing a composite green sheet 38 in different form from the composite green sheet 37 described. A composite slurry 34 is supplied inside a casting head 5 arranged above a carrier film 4. Magnetic particles 36 are distributed in the dielectric slurry 35 used for preparing the dielectric green sheet to obtain composite slurry 34. The carrier film 4 is transported at a predetermined speed to thereby apply the composite slurry 34 delivered from the casting head 5 onto the film 4 to a predetermined thickness. The composite slurry 34 on the film 4, thereafter, is dried to obtain the composite green sheet 38 inside which the particle portions comprising the magnetic particles 36 are uniformly distributed.

Magnetic ceramic powder before firing can be used as the magnetic particles 36. Further, powder made from the magnetic ceramic material is fired and thereafter pulverized to obtain magnetic pieces. The obtained pieces can also be used as the particles 36. In this case, usable as the magnetic ceramic material is the material having a higher temperature in firing than the dielectric green sheet.

Next, a plurality of circuit element patterns are printed with silver on the surface of each of a required number of the composite green sheets and a required number of the dielectric green sheets to obtain a plurality of boards. The boards are arranged in superposed layers to obtain a laminate body.

The laminate body is thereafter fired at a high temperature of 800° C. to 1000° C. to obtain an integral sintered laminate. Finally a plurality of electronic components are mounted on the surface of the sintered laminate as required to complete a composite device of the laminate type in the form of a single chip.

In the composite device of the laminate type using the composite green sheets 38 shown in FIG. 4, the composite ceramic layer obtained by firing the composite green sheet 38 comprises a layer portion having a same composition as the dielectric ceramic layer made from dielectric ceramic material, and a plurality of particle portions made from magnetic ceramic material. The particle portions are approximately uniformly distributed inside the layer portion.

With the composite device of the laminate type embodying the invention described, the composite ceramic layer 3 has the same composition in the major portion thereof as the dielectric ceramic layer 2, so that the shrinkage of the composite ceramic layer 3 when fired is close to the shrinkage of the dielectric ceramic layer 2 when fired. Consequently, the difference between the composite layer 3 when fired and the dielectric layer 2 when fired is small in shrinkage. This makes small the deflection of the ceramic layer 3 or 2 in the firing step and inhibits the layer 3 or 2 from cracking or separating, resulting in a higher yield than conventionally.

The strip portion 32 of the composite ceramic layer 3 is made from the magnetic ceramic material to have the portion magnetized. The L pattern arranged on the surface of the composite ceramic layer has a greater inductance than the L pattern having the same size and arranged on the surface of the non-magnetized dielectric ceramic layer 2.

Furthermore, the composite ceramic layer 3 can be prepared by using the dielectric green sheets for the material of the dielectric ceramic layer 2. Accordingly, only one kind of the green sheet is required for preparing the composite device of the laminate type.

The device and process of the present invention are not limited to the foregoing embodiment in construction but can be modified variously by one skilled in the art without departing from the spirit of the invention as set forth in the appended claims.

What is claimed is:

1. A laminate device for use in electronic devices, comprising:
    a first ceramic portion comprising:
        one or more first ceramic layers, and
        one or more circuit element patterns formed on a surface of said first ceramic layer, each of said first ceramic layers comprising a dielectric material; and
    a second ceramic portion comprising:
    one or more second ceramic layers, and
    one or more circuit element patterns formed on a surface of said second ceramic layer, each of said second ceramic layers comprising:

said dielectric material, and a plurality of particle portions formed of a magnetic material approximately uniformly dispersed within said second ceramic layer or approximately uniformly distributed on a surface of said second ceramic layer, wherein said one or more circuit element patterns provide an electronic circuit for performing a predetermined function, and said first ceramic portion is provided on said second ceramic portion to produce said laminate device, wherein one of said first ceramic layers of said first ceramic portion and one of said second ceramic layers of said second ceramic portion are directly stacked on each other, wherein at least one of said circuit element patterns formed on said surface of said first ceramic layer is a capacitor pattern, and at least one of said circuit element patterns formed on said surface of said second ceramic layer is an inductance pattern.

2. The laminate device according to claim 1, wherein said particle portions are approximately uniformly distributed on said surface of said dielectric material.

3. The laminate device according to claim 1, wherein said particle portions include magnetic particles approximately uniformly distributed in said dielectric material.

* * * * *